(12) United States Patent
O'Carroll et al.

(10) Patent No.: US 6,559,424 B2
(45) Date of Patent: May 6, 2003

(54) WINDOWS USED IN THERMAL PROCESSING CHAMBERS

(75) Inventors: Conor Patrick O'Carroll, Sunnyvale, CA (US); Rudy Santo Tomas Cardema, San Jose, CA (US); James Tsuneo Taoka, San Jose, CA (US); Zion Koren, Sunnyvale, CA (US)

(73) Assignee: Mattson Technology, Inc., San Jose, CA (US)

( * ) Notice: Subject to any disclaimer, the term of this patent is extended or adjusted under 35 U.S.C. 154(b) by 206 days.

(21) Appl. No.: 09/753,216

(22) Filed: Jan. 2, 2001

(65) Prior Publication Data

US 2002/0084424 A1 Jul. 4, 2002

(51) Int. Cl.$^7$ .................................................. F27B 5/14
(52) U.S. Cl. ........................ 219/390; 219/405; 219/411; 392/416; 392/418; 118/724; 118/50.1
(58) Field of Search ................................ 219/390, 405; 219/411; 392/416, 418; 118/724, 725, 50.1

(56) References Cited

U.S. PATENT DOCUMENTS

| | | | |
|---|---|---|---|
| 4,184,480 A | 1/1980 | Kenny | |
| 4,409,511 A | 10/1983 | Loda et al. | |
| 4,427,378 A | 1/1984 | Bowers | |
| 4,680,447 A | 7/1987 | Mahawili | |
| 4,920,918 A | 5/1990 | Adams et al. | |
| 4,945,251 A | 7/1990 | Bechtold et al. | |
| 5,145,716 A | 9/1992 | Paserin et al. | |
| 5,152,060 A | 10/1992 | Schubert et al. | |
| 5,743,643 A | 4/1998 | Gronet et al. | |
| 5,762,713 A | 6/1998 | Paranjpe | |
| 5,781,693 A | 7/1998 | Ballance et al. | |
| 5,790,751 A | 8/1998 | Gronet et al. | |
| 5,863,334 A | 1/1999 | Chou et al. | |
| 5,960,158 A | * 9/1999 | Gat et al. | 392/416 |
| 6,143,079 A | * 11/2000 | Halpin | 118/715 |
| 6,148,761 A | 11/2000 | Majewski et al. | |
| 6,284,051 B1 | * 9/2001 | Fidelman | 118/724 |
| 6,435,869 B2 | * 8/2002 | Kitamura | 432/253 |

FOREIGN PATENT DOCUMENTS

| | | |
|---|---|---|
| EP | 715314 A1 | 6/1996 |
| WO | WO 9621238 | 7/1996 |
| WO | WO 9948344 | 9/1999 |

OTHER PUBLICATIONS

Abstract for WO 9948344 Publication Date Sep. 23, 1999.

* cited by examiner

Primary Examiner—Teresa Walberg
Assistant Examiner—Shawntina Fuqua
(74) Attorney, Agent, or Firm—Dority & Manning, P.A.

(57) ABSTRACT

An apparatus for heat treating semiconductor wafers in a thermal processing chamber using light energy is provided. In one embodiment, the apparatus contains a window located between the semiconductor wafer and the energy source. The window contains a member that defines at least one passage capable of being placed into communication with a coolant to cool the window and at least partially offset the "first wafer effect". Additionally, in some embodiments, the window has a thickness greater than about 1 inch so that it can withstand pressures applied during wafer processing.

41 Claims, 8 Drawing Sheets

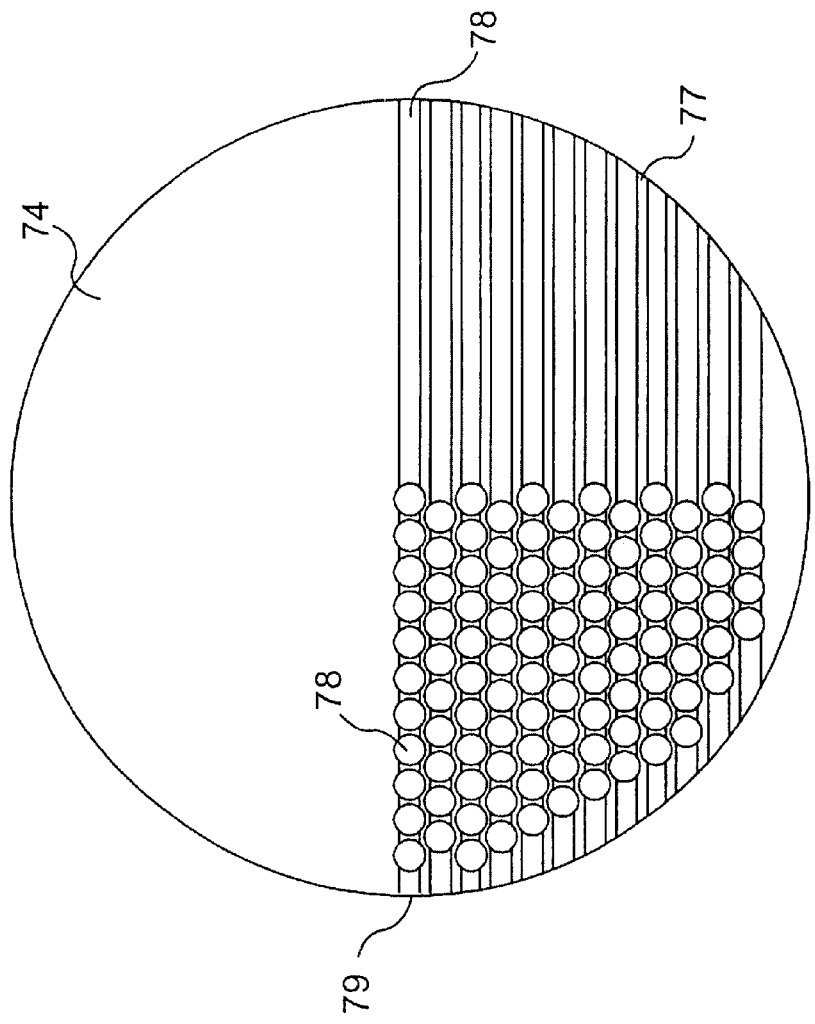
*FIG. 10*
*FIG. 9*
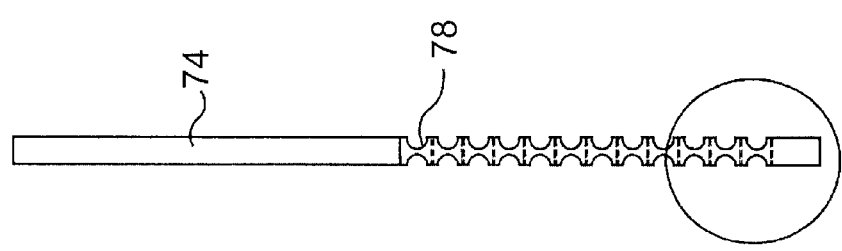
*FIG. 8*

WINDOWS USED IN THERMAL PROCESSING CHAMBERS

BACKGROUND OF THE INVENTION

Many semiconductor heating processes require a wafer to be heated to high temperatures so that various chemical and physical transformations can take place as the wafer is fabricated into a device. During rapid thermal processing, for example, semiconductor wafers are typically heated in a thermal processing chamber by an array of energy sources to high temperatures, such as from about 100° C. to about 1,200° C., for a time that is typically less than a few minutes.

Besides heating semiconductor wafers, thermal processing chambers are also used to chemically react wafers with other components, such as gases. For instance, various gases can be circulated through the thermal processing chamber to react with the surface of the semiconductor wafer during heating to form a desired film or coating on the wafer. For example, steam can be present within the chamber to form oxidation coatings on the wafer. Reactions of this type may be carried out under pressure or under vacuum conditions. Thus, it is often necessary to isolate the thermal processing chamber from the energy source by a window. This window is typically formed of a material that allows for effective transmission of heat energy and that withstands processing pressures.

In the past, these windows were conventionally formed from thin, solid quartz plates. However, one problem with such thin quartz plates is that they possessed an inherently poor mechanical strength to withstand the bending stresses that result from vacuum or fluid pressures generated inside the thermal processing chamber during the heat treatment of a wafer.

Consequently, solid quartz plates having a relatively large thickness have also been utilized. However, one problem with such thick, solid quartz plates is that the plates are difficult to cool after heat treatment is terminated. In particular, after a wafer is heated for a desired time, the light source is immediately shut down so that the wafer can cool very quickly. Unfortunately, due to the relatively low heat conduction coefficient of these thick quartz plates, the window fails to cool down as fast as the wafer and thus, continues to irradiate heat energy back to the wafer. Moreover, as the wafer heats up, it also irradiates energy back to the quartz window. This heating of the wafer and quartz plate continues until a stable temperature is reached. The phenomenon described above, which is often called the "first wafer effect", can substantially decrease the efficiency and throughput of the system, adversely affect the achievement of repeatable uniformity of the wafer temperature, and place a burden on the temperature control system.

As such, a need currently exists for a window that has the strength to withstand processing requirements without substantially effecting the efficiency of the system.

SUMMARY OF THE INVENTION

In accordance with one embodiment of the present invention, an apparatus for heat treating a substrate, such as semiconductor wafer is provided. The apparatus includes a thermal processing chamber and a energy source in communication with the chamber. Further, the apparatus also contains a window that contains a member having a first side facing the substrate and a second side facing the energy source. In some embodiments, the window has a thickness greater than about 1 inch so that it can withstand certain pressures applied during processing. Moreover, the window can also contain a material, such as quartz or sapphire, that is capable of allowing thermal radiation at a preselected wavelength to pass therethrough. Moreover, the first member defines at least one passage that is capable of being placed into communication with at least one coolant, such as air, water, an emulsion, etc. The coolant can, in some embodiments, cool the window at a faster rate and thereby inhibit the onset of the "first wafer effect".

In accordance with another embodiment of the present invention, a method for heat treating a semiconductor wafer is provided. The method includes providing a heat treating apparatus that contains a thermal processing chamber, an energy source, and a window. The method also includes heating the semiconductor wafer to a certain temperature and, after the temperature is reached, terminating the heating of the wafer. Moreover, the method also includes supplying at least one coolant to at least one passage defined by a first member of the window.

Other features and aspects of the present invention are discussed in greater detail below.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended figures in which:

FIG. 8 is an additional side view of the window of FIG. 6;

FIG. 9 is a partially exploded view of the window of FIG. 8;

FIG. 10 is a plan view of the window of FIG. 6;

Repeat use of references characters in the present specification and drawings is intended to represent same or analogous features or elements of the invention.

DETAILED DESCRIPTION OF REPRESENTATIVE EMBODIMENTS

It is to be understood by one of ordinary skill in the art that the present discussion is a description of exemplary embodiments only, and is not intended as limiting the broader aspects of the present invention, which broader aspects are embodied in the exemplary construction.

The present invention is generally directed to a window that is suitable for use in a thermal processing chamber contained within a heat treating apparatus. In particular, the window of the present invention can have suitable strength for withstanding processing pressures and be cooled at a faster rate. For example, in one embodiment, the window can be formed with a member that defines at least one passage capable of being placed into communication with a coolant.

Figure 1:
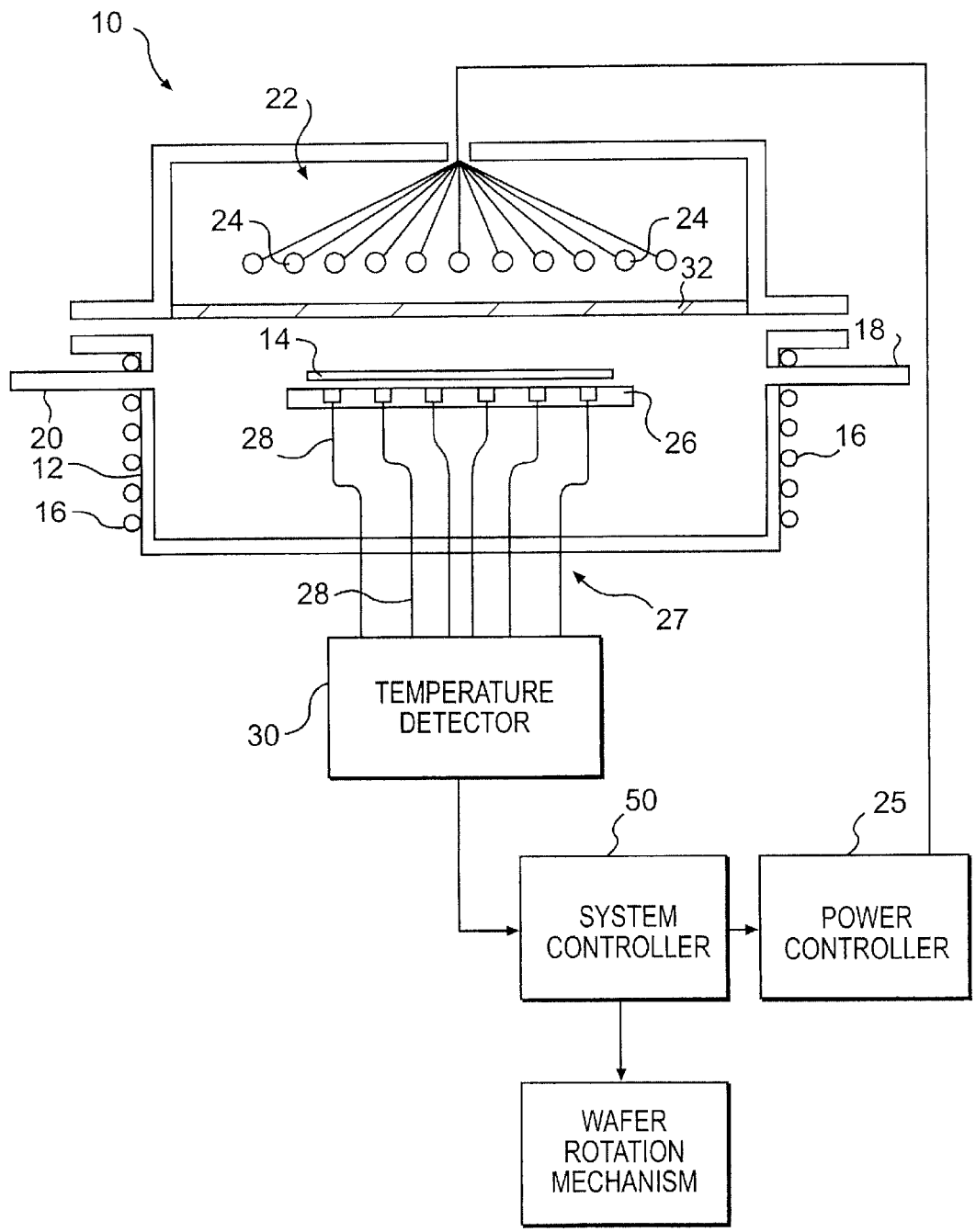
FIG. 1 is a cross-sectional view of one embodiment of an apparatus of the present invention.

Referring to FIG. 1, for example, one embodiment of an apparatus 10 for heat treating a wafer made from a semiconductive material, such as silicon, is illustrated. The apparatus 10 includes a processing chamber 12 adapted to receive substrates, such as a wafer 14, for conducting various processes. As shown, the wafer 14 is positioned on a substrate holder 26 made from a thermal insulating material, such as quartz. The chamber 12 is designed to heat the wafer 14 at very rapid rates and under carefully controlled conditions. The chamber 12 can be made from various materials, including, for example, metals and ceramics. For instance, in some embodiments, the chamber 12 can be made from stainless steel or quartz.

When the chamber 12 is made from a heat conductive material, it typically includes a cooling system. For instance, as shown in FIG. 1, the chamber 12 includes a cooling conduit 16 wrapped around the perimeter of the chamber 12 or contained within holes of the chamber 12.

The chamber 12 also includes an inlet 18 and an outlet 20 for introducing liquids and gases into the chamber and/or for maintaining the chamber 12 within a preset pressure range. For instance, a gas or vapor can be introduced into the chamber 12 through the inlet 18 for reaction with the wafer 14. The gas can then be evacuated from the chamber using the outlet 20. In one embodiment, for example, water vapor can be introduced into the chamber 12 for forming an oxidation coating on the wafer 14. It should also be understood, however, that besides water vapor, various other liquid vapors and/or gases can be introduced into the chamber for reaction with the wafer 14.

Alternatively, an inert gas can be fed to the chamber 12 through the inlet 18 for preventing any unwanted or undesirable side reactions from occurring within the chamber. In a further embodiment, the gas inlet 18 and the gas outlet 20 can be used to pressurize the chamber 12. A vacuum can also be created in the chamber 12 when desired, using the gas outlet 20 or an additional larger outlet positioned beneath the level of the wafer 14.

During processing, the substrate holder 26, in one embodiment, can be adapted to rotate the wafer 14 using a wafer rotation mechanism. Rotating the wafer 14 may promote better temperature uniformity over the surface of the wafer 14 and may promote enhanced contact and gas uniformity between the wafer 14 and any gases introduced into the chamber 12. It should be understood, however, that besides wafers, the chamber 12 is also adapted to process other substrates, such as optical parts, films, fibers, ribbons, etc.

As shown, an energy source 22 is also provided in the apparatus 10. In particular, the energy source 22 is placed into communication with the chamber 12 for emitting energy to heat the wafer 14 during processing. In general, a variety of heating devices can be utilized as the energy source 22. For example, the energy source 22 can contain lights, lasers (e.g., a nitrogen laser), ultraviolet radiation heating devices, arc lamps, flash lamps, infrared radiation devices, combinations thereof, and the like. Moreover, the spectral shape and/or certain properties (e.g., intensity, polarization, continuous and/or pulsed emission radiation) of the energy source 22 can be varied to adapt to a particular process. For instance, the spectral shape of the energy source 22 can be controlled as a function of time and/or as a function of a property of the substrate or film(s) on the substrate (e.g., temperature of the film(s) and/or substrate, the thickness of a film being deposited on the substrate, or any other physical or chemical parameter of the film(s) or substrate).

In the illustrated embodiment, for example, the energy source 22 includes a plurality of lamps 24. The lamps 24 can be incandescent lamps, such as tungsten-halogen lamps. The energy source 22 can also include a reflector or a set of reflectors for uniformly directing energy being emitted by the lamps 24 onto the wafer 14. As shown in FIG. 1, the lamps 24 are placed above the wafer 14. It should be understood, however, that the lamps 24 may be placed at any particular location. For example, lamps may be utilized above and/or below the wafer 14. Further, additional or less lamps can be included within the apparatus 10 if desired.

In order to monitor the temperature of the wafer 14 during the heating process, the chamber 12 can, in one embodiment, include a plurality of radiation sensing devices 27. The radiation sensing devices 27 can include, for example, a plurality of optical fibers, lenses, light pipes, etc. For example, in the illustrated embodiment, the radiation sensing devices include light pipes 28 that are in communication with a plurality of corresponding temperature detectors 30. In one embodiment, for example, the optical fibers 28 are configured to receive thermal energy being emitted by the wafer 14 at a particular wavelength. The amount of sensed radiation is then communicated to temperature detectors 30, which generate a usable voltage signal for determining the temperature of the wafer which can be calculated based, in part, on Planck's Law. In one embodiment, each optical fiber 28 in combination with a temperature detector 30 comprises a pyrometer. In another embodiment, the optical fibers, 28, are routed to a single but multiplexing radiation sensing device.

Besides using radiation sensing devices, other temperature sensing devices may also be used in the system of the present invention. For instance, one or more thermocouples may be incorporated into the system for monitoring the temperature of the wafer 14 at a single location or at a plurality of locations. The thermocouples can be placed in direct contact with the wafer 14 or can be placed adjacent the wafer 14 from which the temperature can be extrapolated.

In some embodiments, as shown, the apparatus 10 can also include a system controller 50 that can be, for instance, a microprocessor. The controller 50 receives voltage signals from the temperature detectors 30 that represent the radiation amounts being sampled at the various locations. Based on the signals received, the controller 50 is configured to calculate the temperature of the wafer 14 at different locations.

The system controller 50, as shown in FIG. 1, can also be in communication with a lamp power controller 25. In this arrangement, the controller 50 can determine the temperature of the wafer 14, and, based on this information, control the amount of thermal energy being emitted by the lamps 24. In this manner, relatively instantaneous adjustments can be made regarding the conditions within the chamber 12 for processing the wafer 14 within carefully controlled limits.

In one embodiment, the controller 50 can also be used to automatically control other elements within the apparatus 10. For instance, the controller 50 can be used to control the flow rate of gases entering the chamber 12 through the gas inlet 18. As shown, the controller 50 can further be used to control the rate at which the wafer 14 is rotated within the chamber 12.

In accordance with one embodiment of the present invention, the apparatus 10 also includes a window 32 positioned between the energy source 22 and the wafer 14 that is capable of allowing energy at a preselected wavelength to pass therethrough. For example, the window 32 can, in some embodiments, act as a filter by allowing certain wavelengths of light to pass therethrough, while absorbing other wavelength(s). In addition, the window 32, in some embodiments, may not act as a filter. For example, in one embodiment, a transparent window 32 can be utilized to allow a laser, such as a nitrogen laser that emits light at a wavelength of 337 nanometers, to be emitted from the energy source 22 onto the wafer 14. In this embodiment, the window 32 need not act as a filter.

Figure 2:
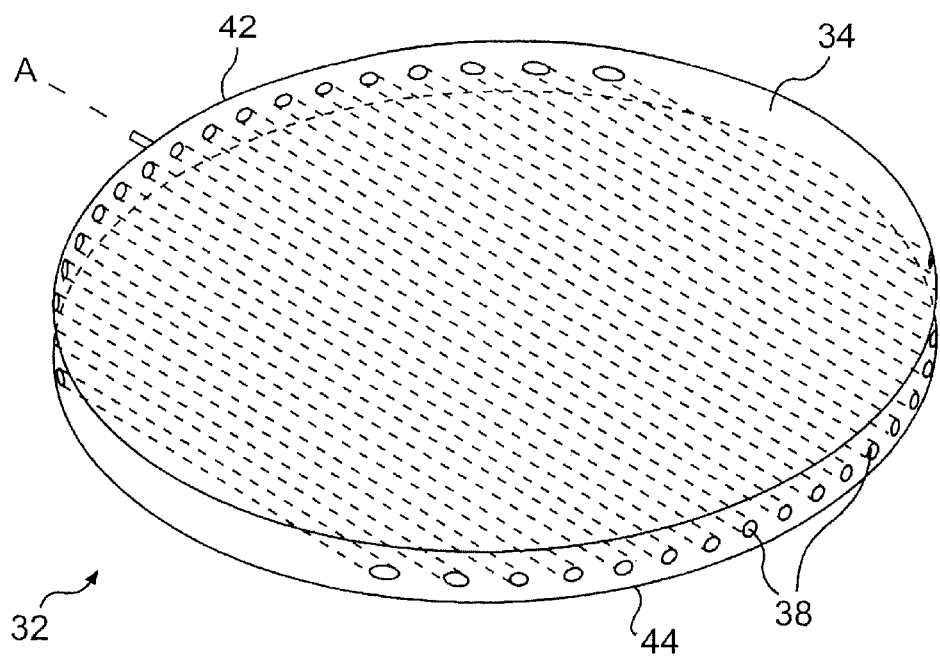
FIG. 2 is a perspective view of one embodiment of a window of the present invention.

The window 32 can generally have a variety of different shapes and/or sizes. For example, as shown in FIG. 2, the window 32 can have a circular shape. In one embodiment, for instance, when the wafer 14 has a diameter of 12 inches, the window 32 can, in some embodiments, have a diameter between about 15 inches to about 20 inches. Moreover, in some instances, the window 32 may also have a dome-shape, which may increase the structural strength of the window 32 without significantly affecting the ability of the window 32 to be cooled.

Further, the window 32 can also be made from a variety of different materials. For instance, in some embodiments, the window 32 can be made from fused silica, quartz, sapphire, and the like. Quartz, for example, is known to absorb thermal radiation effectively at selected wavelengths.

Moreover, the window 32 can also be made from one or multiple members. For example, as shown in FIGS. 6–10, the window 32 can contain an inner member 74 positioned between two outer members 64 and 84. In some embodiments, the inner member 74 can be made from one material, while the outer members 64 and 84 can be made from different materials. It should be understood, however, the window 32 can be made from any material and contain any number of members.

Figure 3:
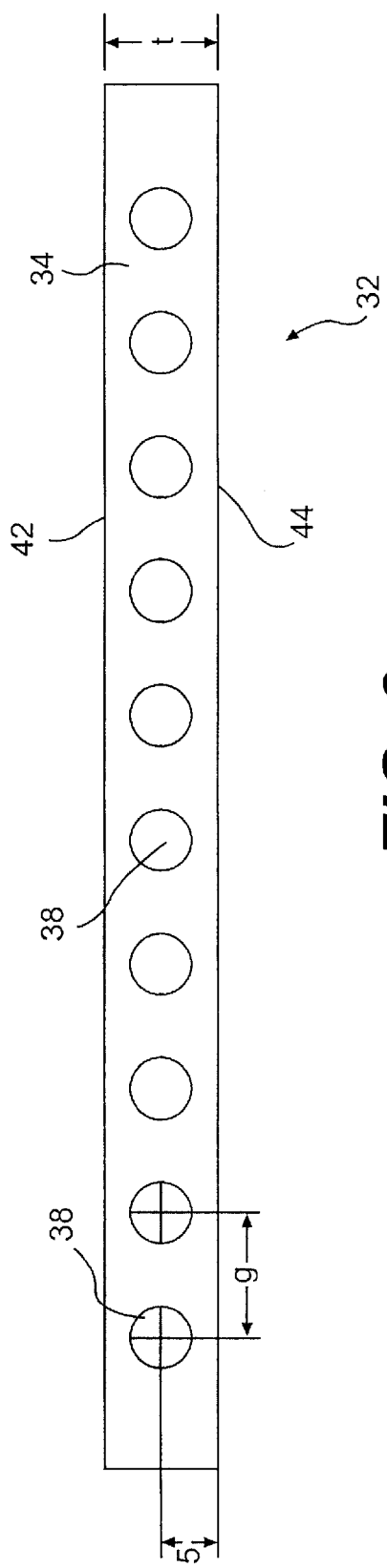
FIG. 3 is a cross-sectional view of the window of FIG. 2.

Regardless of the particular material(s) and/or number of members utilized, the window 32 typically has a thickness such that it can withstand the pressures and stresses of the applicable heat treating process. For instance, for processes in which relatively high pressures are reached within the chamber, the window 32 may have a relatively large thickness. On the other hand, for processes in which relatively low pressures are utilized within the chamber, the window 32 may be thinner. For example, as shown in FIG. 3, in some embodiments, the thickness "t" of the window 32 can be greater than about 1 inch, in some embodiments, between about 1 inch to about 2 inches, and in some embodiments, between about 1 inch to about 1.75 inches. It is believed that such thickness values are suitable for most high and low pressure heat treating processes. However, it should also be understood that the thickness of the window 32 may be greater or less than the exemplary values set forth above.

Besides being able to withstand the pressures and stresses of a heat treating process, the window 32 is also capable of being cooled relatively quickly to inhibit the onset of the "first wafer effect". In particular, the window 32 contains at least one member that defines at least one passage to allow the circulation of a coolant (e.g., gas or fluid) therein. The passage(s) can generally be provided in a variety of different forms. For example, the passage(s) may include, but are not limited to, holes, depressions, grooves, channels, etc., formed into the filter window. These passage(s) are configured to allow a liquid, for example, to flow through or within the window 32 such that it can be cooled at a relatively fast rate. For example, in one embodiment, the window 32 can be dome-shaped such that the domed surface is formed with a groove that can be contacted with a coolant.

In this regard, various embodiments of windows of the present invention containing a member that defines at least one passage will now be described in more detail. However, it should be understood that other window constructions not specifically described herein are also contemplated by the present invention.

For instance, referring to FIG. 2, one embodiment of a window 32 is illustrated. As shown, the window 32 contains a member 34 that defines a plurality of passages 38, which in this embodiment, are in the form channels. The passages 38 allow a coolant to be supplied to one end 42 of the window 32 and exit at another end 44 of the window 32, and vice versa.

Figure 13:
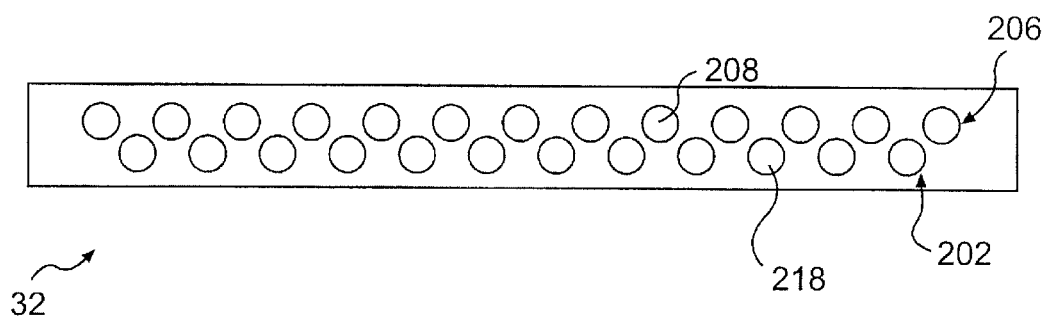
FIG. 13 is a cross-sectional view of another embodiment of a window of the present invention.

In general, any number of passages 38 may be utilized. In some embodiments, the number of passages 38 may be selected to optimize the particular rate of cooling needed for a given application. For instance, increasing the number of passages 38 typically allows the window 32 to be cooled at a faster rate. Thus, in some embodiments, the number of passages 38 may be increased or decreased by adjusting the distance at which the passages 38 are placed from one another. For instance, as shown in FIG. 3, the separation distance "g" can, in one embodiment, be between about 0.6 inches to about 1.6 inches. Moreover, if desired, the separation distance "g" can vary for different sets of passages 38. Specifically, some passages 38 may be placed a certain distance apart, while other passages 38 may be placed a different distance apart. Further, in other embodiments, such as shown in FIG. 13, passages can be positioned in a staggered arrangement.

Besides varying the number and separation distance of the passages 38, the size and/or shape of the passages 38 can also be selected to attain the desired cooling rate. For instance, the passages 38 may be in the shape of a circle, oval, square, etc. Moreover, as stated, the size of the passages 38 may also be varied. In some embodiments, for example, the passages 38 can have a circular shape, as shown in FIG. 2, and have a diameter ranging from about 0.20 inches to about 0.50 inches, and in some embodiments, between about 0.25 inches to about 0.40 inches.

Furthermore, in some embodiments, it may also be desired to vary the geometrical orientation of the passages 38. For instance, in the embodiment depicted in FIG. 2, the passages 38 are oriented parallel to each other and to the top and bottom surfaces 42 and 44 of the window 32. However, it should also be understood that the passages 38 can generally be oriented in any manner desired, so long as a coolant is capable of being placed in communication with the passages 38 to cool the window 32. For example, in some embodiments, the passages 38 may be positioned at an angle to the horizontal axis A of the window 32 such that at least a portion of the coolant flow is driven by gravitational forces.

In addition, it is sometimes desired to provide more cooling to certain portions of the window 32 than to other portions. Thus, if desired, the height dimension "h" of the passages 38 can be appropriately adjusted to provide the cooling desired. For instance, a relatively small height dimension will typically provide more cooling to the bottom surface 44 of the window 32, while a relatively large height dimension will typically provide more cooling to the top surface 42 of the window 32. For example, it is typically desired that the passages 38 be located nearer to the bottom surface 44 to better offset the "first wafer effect". Moreover, in some embodiments, such as depicted in FIG. 2, the height dimension "h" can be such that the passages 38 are spaced approximately equally from the bottom surface 44 and the top surface 42 of the window 32.

Figure 4:
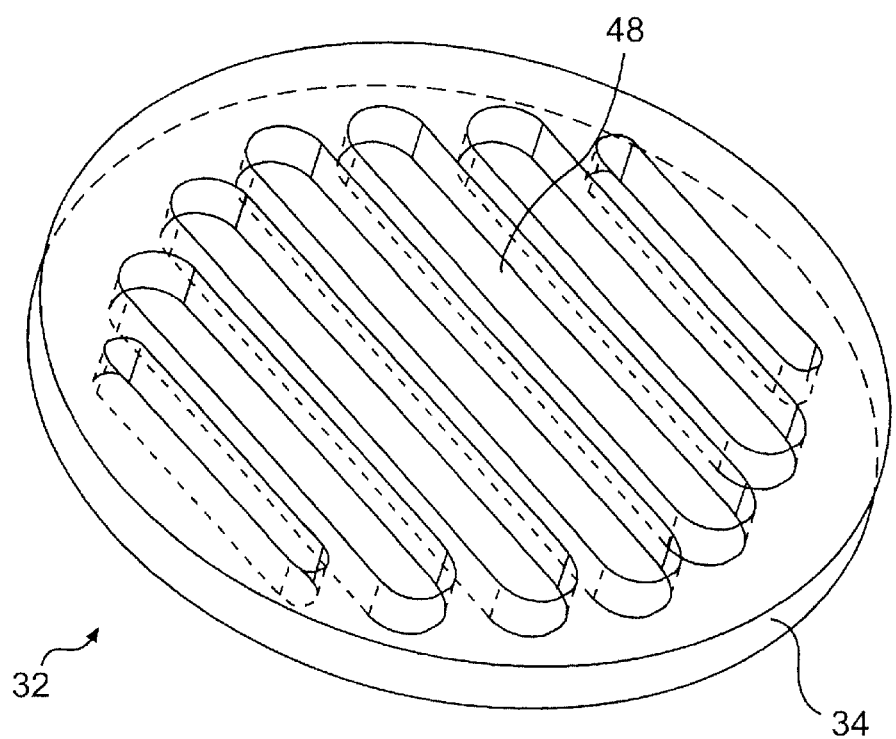
FIG. 4 is a perspective view of another embodiment of a window of the present invention.

Referring to FIG. 4, another embodiment of the window 32 is illustrated. For instance, as shown, the window 32 contains a member 34 that defines a plurality of passages 48, which in this embodiment, are in the form of grooves. In this embodiment, the passages 48 do not extend through the entire thickness of the member 34, although the passages 48 may extend through the member 34 if desired.

Figure 5:
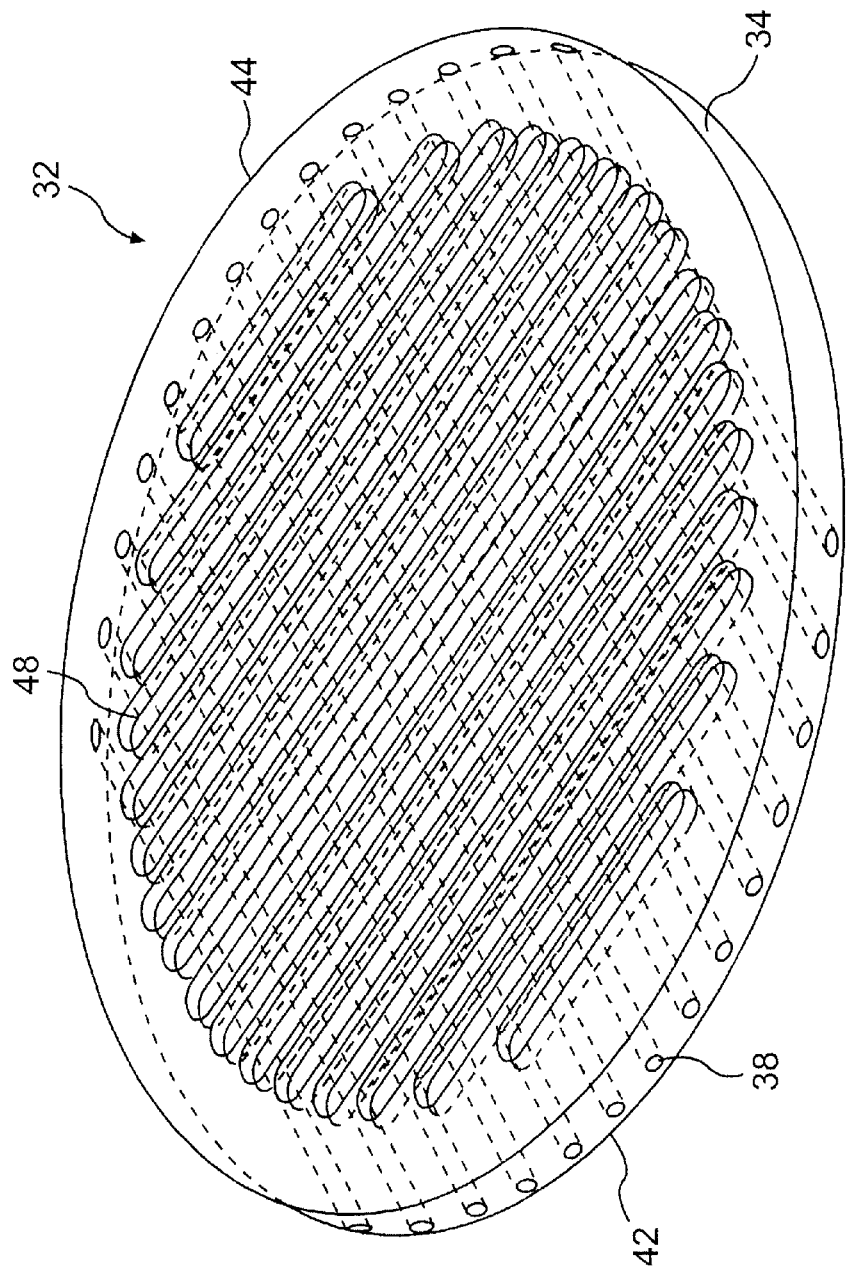
FIG. 5 is a perspective view of another embodiment of a window of the present invention.
Figure 6:
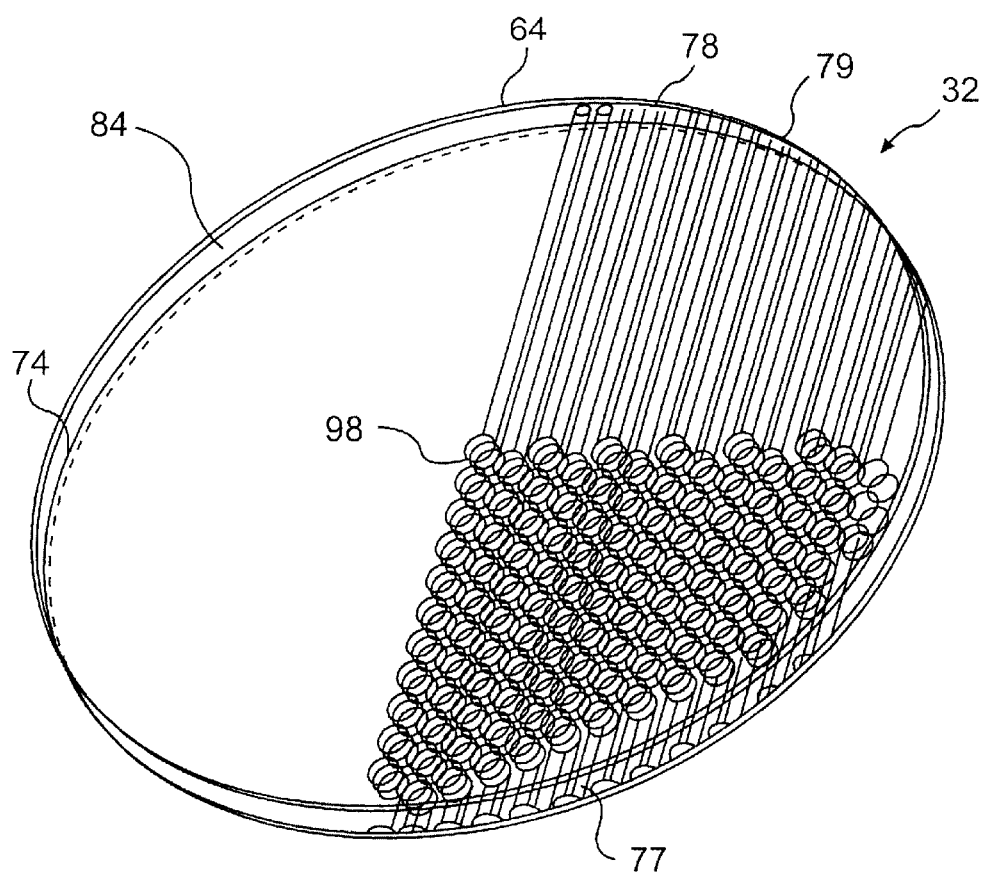
FIG. 6 is a perspective view of another embodiment of a window of the present invention.
Figure 7:
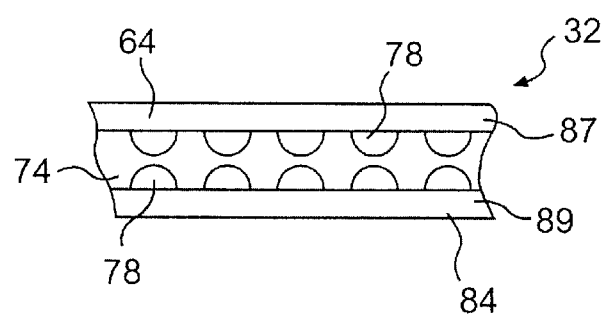
FIG. 7 is a side view of the window of FIG. 6.
Figure 12:
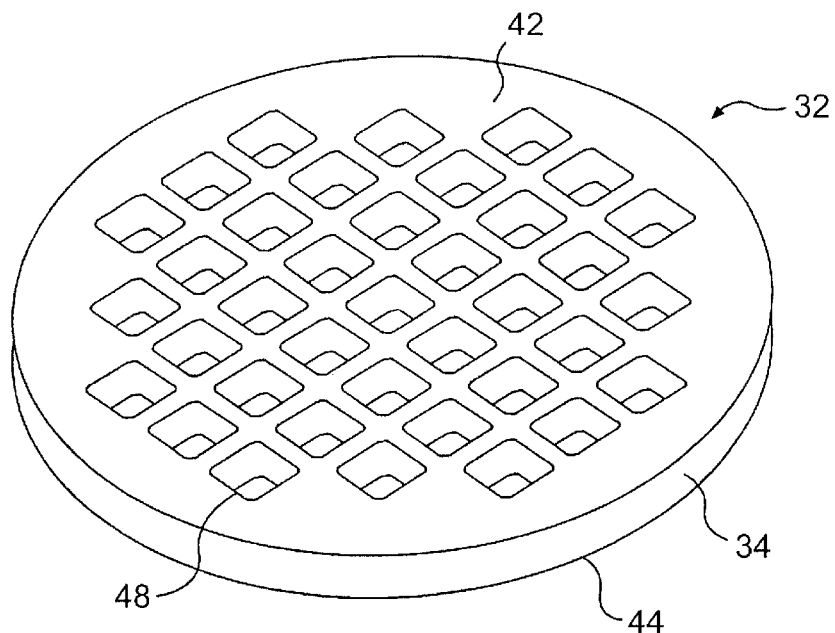
FIG. 12 is a perspective view of another embodiment of a window of the present invention.

The passages 48 can generally be of any shape and/or size. For instance, as shown in FIG. 12, the passages 48 may have a square or cellular shape. Moreover, the passages 48 can also be positioned at a variety of heights and spaced apart from one another at any desired distance. Further, the passages 48 can have any desired geometrical orientation with respect to each other and to the plate 34. As discussed above, any of the above-mentioned parameters may be selectively varied to optimize the strength and/or the cooling rate of the window 32 for certain processes. For example, in one embodiment, the passages 48 are formed out of the top surface 42 to provide additional cooling to the top portions of the window 32 after heat treating the wafer. The passages 48 can provide a variety of benefits to the resulting window 32. For instance, the passages 48 can reduce the mass of the window 32 and increase its surface area, thereby increasing the overall heat transfer rate of the window 32. Further, in some embodiments, as shown in FIG. 5, the passages 48 can also be used in conjunction with the passages 38, as described above, to further facilitate cooling of the window 32.

Referring to FIGS. 6–10, another embodiment of the window 32 is illustrated. For instance, as shown, the window 32 contains an inner member 74 sandwiched between and attached to relatively thin, outer members 64 and 84. The inner member 74 is relatively thick and defines a plurality of passages 78, which in this embodiment, are in the form of channels. In this embodiment, the passages 78 extend from a first end 77 of the window 32 to a second end 79 of the window 32 to allow the flow of a coolant therethrough. The passages 78 can generally be of any shape and/or size. For example, in the illustrated embodiment, the passages 78 have a semi-circular shape, although any other shape may be utilized.

Moreover, the passages 78 can also be positioned at a variety of heights and spaced apart from one another at any desired distance. Further, the passages 78 can have any desired geometrical orientation with respect to each other and to the member 74. As discussed above, any of the above-mentioned parameters may be selectively varied to optimize the strength and/or the cooling rate of the window 32 for certain processes. For example, in one embodiment, the passages 78 are formed out of the top surface 87 and the bottom surface 89 to provide additional cooling to both surfaces 87 and 89 of the inner member 74.

Further, in some embodiments, as shown, the passages 78 can also be used in conjunction with other passages 98. As shown, in this embodiment, the passages 98 are in the form of channels that extend through the inner member 74. The passages 98 can be spaced apart from one another at any desired distance. Further, the passages 98 can have any desired geometrical orientation with respect to each other and to the plate 74. As discussed above, any of the above-mentioned parameters may be selectively varied to optimize the strength and the cooling rate of the window 32 for certain processes.

Moreover, the passages 98 can generally be of any shape and/or size. For example, in the illustrated embodiment, the passages 98 are circular in shape and have a diameter that is slightly greater than the diameter of the semi-circular passages 78. By having such a diameter, the passages 98, in conjunction with the passages 78, can form a honeycomb structure. Such a honeycomb structure can provide a variety of benefits to the window 32. For example, a honeycomb structure can provide a reduction in mass and an increase in the interior surface area. For instance, a coolant can enter the window 32 through the passages 78. As the coolant flows through the passages 78, it can also enter the passages 98. Thus, the coolant can contact a relatively large surface area of the window 32, thereby increasing its cooling rate.

Figure 11:
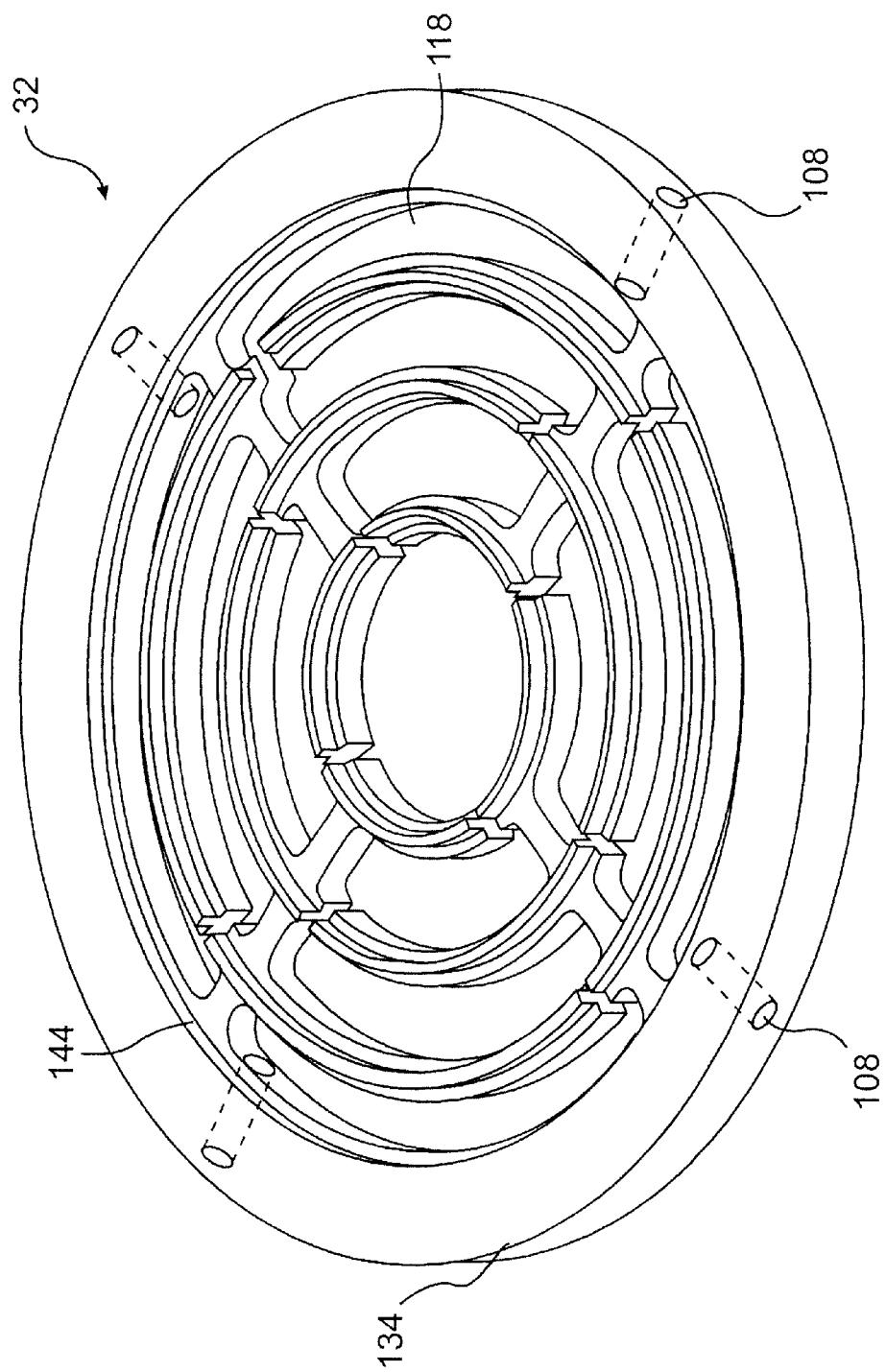
FIG. 11 is a perspective view of another embodiment of a window of the present invention.

Referring to FIG. 11, another embodiment of the window 32 is illustrated. For instance, as shown, the window 32 contains a relatively thick member 134 attached to a relatively thin cover member 144. The thick member 134 defines various passages 108, which in this embodiment, are utilized as inlets and outlets for a coolant flowing through the window 32. The member 134 also defines a number of concentric and discontinuous passages 118. These passages 118 are in communication with the passages 108 such that a coolant entering the window 32 can flow through the passages 108 and into the passages 118. Thus, by utilizing a complicated pattern of passages, such as the concentric passages shown in FIG. 11, the cooling profile for the window 32 can be selectively varied as desired. For example, if more coolant flow is desired through the center of the window than at the edges, a more circuitous route for passages through the center of the window 32 can be utilized.

In some embodiments, the window 32 can also be designed to absorb thermal radiation at a preselected wavelength that differs from the preselected wavelength passing therethrough. In particular, although not required, such a window can allow the temperature detectors 30 to only detect thermal radiation being emitted by the wafer 14 and not radiation being emitted by the lamps 24. For example, in one embodiment, quartz having a relatively high concentration of —OH ions can be used to absorb light at a wavelength of approximately 2.7 micrometers and allow other wavelengths to pass therethrough. Thus, in this embodiment, the temperature detectors 30 can be configured to detect thermal radiation being emitted by the wafer 14 at a wavelength of about 2.7 micrometers. Moreover, in another embodiment, as shown in FIGS. 6–10, the window may contain aan inner member 74 containing "high —OH level" quartz and outer members 64 and 84 containing "low —OH level" quartz, which allows light at a wavelength of 2.7 micrometers therethrough.

Once formed, such as described above, the window 32 may then be supplied with one or more coolants such that it may be cooled after heat treatment of the wafer is terminated. In general, any of a variety of coolants may be utilized. For instance, the coolant can be a gas, such as air, or a fluid, such as liquid water. When cooling the window 32, such as shown in FIG. 4 or 12, for example, air can be circulated over the surface of the window 32 to provide the desired cooling.

Further, when utilized, it is often desired that a liquid coolant have a relatively low boiling point so that it can absorb a large amount of heat through a phase change. For example, in some embodiments, one or more of the passages can be oriented at an angle such that at least a portion of the coolant flow is driven by gravitational forces. As a result, the need for a pressure difference across the passages is somewhat reduced, thereby allowing the passages to possess a liquid void above the liquid. In this void, vapors may be produced by evaporating the coolant. Thus, in such instances, a greater amount of heat can be absorbed by the coolant.

Moreover, in some embodiments, the particular coolant selected can influence the optical nature of the window 32. For example, in certain instances, passages formed in the window 32 can effect the optical homogeneity that exists across the surface of the window. Thus, to limit disturbing optical effects, coolants having an index of refraction that is equal to or approximates the index refraction of the material used in forming the window 32 can be utilized. For example, in one embodiment, an oil coolant can be utilized to closely approximate the index of refraction of quartz.

For example, a water-in-oil emulsion may sometimes be used as the coolant. To produce such an emulsion, an oil such as, for example, paraffin oil, may be exposed to low concentrations of water or water vapor at a certain temperature. For example, if the temperature of the emulsion is lower than the saturation temperature, water within the emulsion is in the form of a liquid (e.g., in the form of small nebula droplets), thereby decreasing the transparency of the coolant. Upon heating above the saturation temperature, however, the water within the emulsion vaporizes or is solved in the liquid, thereby increasing the transparency of the coolant such that a greater amount of light can pass therethrough. Thus, by controlling the temperature, pressure, etc., of the coolant, additional control over the resulting transparency of the window 32 can be provided. In some embodiments, for example, the coolant emulsion may contain at least two liquids and/or any liquid-solid combination having optical properties that may be altered as a function of emulsion temperature, pressure, concentration or any other suitable property.

Moreover, it may also be desired to vary the coolant utilized during different processing steps due to different physical properties of coolants, such as heat capacity and/or index of refraction. For example, it may be advantageous to design the window 32 with the ability to switch between a choice of coolants. Specifically, different coolants, such as water and oil, which absorb lamp and wafer radiation differently, can be used during different processing steps, such as during ramping up, steady state operation, ramping down, etc.

Furthermore, in some embodiments, the window can contain a member that defines one set of passages for one coolant and another set of passages for another coolant. For example, as shown in FIG. 2, one coolant (e.g., water) can be provided to the eight middle passages 38, while another coolant, such as oil, can be provided to the eight outer passages 38 (four on each side). Moreover, as shown in FIG. 13, the window 32 can have two rows 200 and 202 containing passages 208 and 218, respectively. In this embodiment, the rows 200 and 202 are staggered, i.e., offset from each other and located in different planes. Such a staggered arrangement can ensure that the incident light contacts at least one coolant before passing through the window. Moreover, in this embodiment, the staggered arrangement also allows for one coolant to be supplied to the passages 208 during one processing step, while another coolant is supplied to the passages 218 during another processing step.

Alternatively, it may be advantageous to provide different cooling properties to different parts of the window 32. Such an alternative could be accomplished by providing different coolants to different areas of the window 32. For example, referring again to FIG. 2, one coolant, such as oil, may be used in some of the passages 38, while another coolant, such as water, can be used at other passages 38. Moreover, if desired, either of the coolants can then be later switched to a different coolant for another processing step.

As stated above, in some embodiments, a system controller 50, such as a microprocessor, can be utilized. If desired, the flow rate of the coolant, the selection of a certain coolant, etc., can also be controlled by the controller 50. In this manner, relatively instantaneous adjustments can be made regarding the particular cooling rate or optical properties of the window for a certain process. For example, a certain optical property can be selected for the window 32 during ramp up. During ramp down, however, the controller 50 can cause the flow rate, etc., of the coolant to be altered such that the window 32 has a different optical property.

Moreover, by controlling the flow rate and/or other parameters of the coolant, the window 32 can sometimes be cooled at a predetermined temperature profile. For instance, in one embodiment, the window 32 can be cooled such that it has a concentric temperature profile across the window 32, i.e., the window 32 has a positive temperature gradient from its center to its outer edges. As a result of such a temperature profile, the wafer 14 can, in some embodiments, be cooled at a more uniform rate. Besides being utilized to cool the window 32, it should also be understood that the passage(s) defined by a member of the window 32 may also be utilized for other reasons as well. For instance, in one embodiment, the window 32 can contain a member that defines one or more passages that are capable of being utilized to deliver a certain material (e.g., a gas or other material capable of reacting with the substrate and/or film(s) deposited on the substrate) to the thermal processing chamber 12. In one embodiment, for example, as shown in FIGS. 1–2, the passages 38 can be placed into communication with an inlet nozzle (not shown) for supplying a material to the passages 38. In addition, the side of the window 32 facing the wafer 14 can be provided with holes or nozzles (not shown) such that the material can enter the passages 38 and flow through the holes or nozzles to contact the wafer 14. For instance, in one embodiment, the material can be used in chemical vapor deposition processes to chemically react with the substrate and/or film(s) deposited thereon, to cause diffusion of dopants or changes in the physical state of the substrate and/or film(s) deposited thereon, etc. If desired, more than one material can also be supplied to the window 32 using different passages that may be separated or connected to one another. Thus, in one embodiment, one material may be supplied to the wafer 14 for a first reaction, and a second material may thereafter be supplied to the wafer 14 for a second reaction.

In some embodiments, the window 32 may also be provided with an energy source that used separately and/or in conjunction with the energy source 22. For instance, in one embodiment, a rod-shaped tungsten halogen lamp can be placed into one or more passages of the window 32. If desired, a coolant may thereafter be supplied to the passage containing the energy source for cooling the energy source.

These and other modifications and variations of the present invention may be practiced by those of ordinary skill in the art, without departing from the spirit and scope of the present invention, which is set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. An apparatus for heating a semiconductor wafer comprising:
   a thermal processing chamber adapted to contain the semiconductor wafer;
   an energy source in communication with said thermal processing chamber for heating said semiconductor wafer contained in said chamber; and
   a window positioned between said energy source and said semiconductor wafer, said window containing a material that is capable of allowing thermal radiation at a first preselected wavelength to pass therethrough, said window containing a first member having a first side facing said semiconductor wafer and a second side facing said energy source, said first member defining at least one passage that is capable of being placed into communication with at least one coolant.

2. An apparatus as defined in claim 1, wherein said material of said window is quartz, sapphire, fused silica, or combinations thereof.

3. An apparatus as defined in claim 1, wherein said at least one passage is located nearer to said first side of said first member.

4. An apparatus as defined in claim 1, wherein said at least one passage extends through said first member.

5. An apparatus as defined in claim 1, wherein said window further contains a second member.

6. An apparatus as defined in claim 1, wherein said coolant is capable of altering the index of refraction of said window when contained therein.

7. An apparatus as defined in claim 6, wherein said coolant approximates the index of refraction of said material of said window.

8. An apparatus as defined in claim 1, wherein said coolant is an emulsion.

9. An apparatus as defined in claim 1, wherein said window has a thickness greater than about 1 inch.

10. An apparatus as defined in claim 1, wherein said window has a thickness of between about 1 inch to about 1.75 inches.

11. An apparatus as defined in claim 1, wherein said passage is circular or semi-circular in shape.

12. An apparatus as defined in claim 11, wherein the diameter of said circular or semi-circular passage is between about 0.20 inches to about 0.50 inches.

13. An apparatus as defined in claim 1, wherein said first member defines at least one passage that is configured to deliver a material to said wafer.

14. An apparatus as defined in claim 1, wherein said material of said window is also capable of absorbing thermal radiation at a preselected wavelength that is different from said first preselected wavelength.

15. An apparatus for heating a substrate comprising:
   a thermal processing chamber adapted to contain the substrate;
   an energy source in communication with said thermal processing chamber for heating said substrate contained in said chamber; and
   a window positioned between said energy source and said substrate, said window including a material that is capable of allowing thermal radiation at a first preselected wavelength to pass therethrough, said material being selected from the group consisting of quartz, sapphire, fused silica, and combinations thereof, said window containing a first member having a first side facing said substrate and a second side facing said energy source, said first member defining a plurality of passages that are capable of being placed into communication with at least one coolant.

16. An apparatus as defined in claim 15, wherein said material of said window is quartz.

17. An apparatus as defined in claim 15, wherein said window has a thickness of greater than about 1 inch.

18. An apparatus as defined in claim 15, wherein said window has a thickness of between about 1 inch to about 1.75 inches.

19. An apparatus as defined in claim 15, wherein at least one of said passages is circular or semi-circular in shape.

20. An apparatus as defined in claim 19, wherein said circular or semi-circular passage has a diameter of between about 0.20 inches to about 0.50 inches.

21. An apparatus as defined in claim 15, wherein at least one of said passages is located nearer to said first side of said first member.

22. An apparatus as defined in claim 15, wherein at least one of said passages extends through said first member.

23. An apparatus as defined in claim 15, wherein said window further contains a second member.

24. An apparatus as defined in claim 15, wherein said coolant is capable of altering the index of refraction of said window when contained therein.

25. An apparatus as defined in claim 24, wherein said coolant approximates the index of refraction of said material of said window.

26. An apparatus as defined in claim 15, wherein said coolant is an emulsion.

27. An apparatus as defined in claim 15, wherein at least one of said passages is configured to deliver a material to said substrate.

28. An apparatus as defined in claim 15, wherein said material of said window is also capable of absorbing thermal radiation at a preselected wavelength that is different from said first preselected wavelength.

29. A method for heat treating a semiconductor wafer, said method comprising:
   providing a heat treating apparatus comprising,
      i) a thermal processing chamber adapted to contain the semiconductor wafer;
      ii) an energy source in communication with said thermal processing chamber for heating said semiconductor wafer contained in said chamber; and
      iii) a window positioned between said energy source and said semiconductor wafer, said window including a material that is capable of allowing thermal radiation at a first preselected wavelength to pass therethrough, said window containing a first member having a first side facing said semiconductor wafer and a second side facing said energy source, said first member defining at least one passage;
   heating said semiconductor wafer to a certain temperature with said energy source; and
   supplying at least one coolant to said passage defined by said first member to cool said window.

30. A method as defined in claim 29, wherein said material of said window is quartz, sapphire, fused silica, or combinations thereof.

31. A method as defined in claim 29, wherein said window has a thickness of greater than about 1 inch.

32. A method as defined in claim 29, wherein said window has a thickness of between about 1 inch to about 1.75 inches.

33. A method as defined in claim 29, wherein said coolant is capable of altering the index of refraction of said window when contained therein.

34. A method as defined in claim 33, wherein said coolant approximates the index of refraction of said material of said window.

35. A method as defined in claim 29, wherein said coolant is an emulsion.

36. A method as defined in claim 29, wherein said coolant is supplied to said passage only after the heating of said semiconductor wafer is terminated.

37. A method as defined in claim 29, wherein said first member defines at least two passages, wherein one of said passages is supplied with a first coolant and the other of said passages is supplied with a second coolant.

38. A method as defined in claim 29, wherein said first member defines at least one passage that is configured to deliver a material to said wafer.

39. A method as defined in claim 29, wherein said window is cooled by said coolant to a predetermined temperature profile.

40. A method as defined in claim 39, wherein said predetermined temperature profile is a concentric temperature profile having a positive gradient from the center of said window to the outer regions of said window.

41. A method as defined in claim 29, wherein said material of said window is also capable of absorbing thermal radiation at a preselected wavelength that is different from said first preselected wavelength.

* * * * *